(12) United States Patent
Nuessle

(10) Patent No.: US 6,944,000 B2
(45) Date of Patent: Sep. 13, 2005

(54) ELECTRICAL SYSTEM LIKE A TESTING SYSTEM FOR TESTING THE CHANNELS OF A COMMUNICATION SYSTEM

(75) Inventor: Heinz Nuessle, Rottenburg (DE)

(73) Assignee: Agilent Technologies, Inc., Palo Alto, CA (US)

( * ) Notice: Subject to any disclaimer, the term of this patent is extended or adjusted under 35 U.S.C. 154(b) by 289 days.

(21) Appl. No.: 10/305,286

(22) Filed: Nov. 26, 2002

(65) Prior Publication Data

US 2003/0189803 A1 Oct. 9, 2003

(30) Foreign Application Priority Data

Apr. 6, 2002 (EP) .............................................. 02007779

(51) Int. Cl.[7] .............................................. H02H 7/10
(52) U.S. Cl. ...................................................... 361/18
(58) Field of Search ............................ 361/18, 111, 56; 323/288, 284, 282, 901

(56) References Cited

U.S. PATENT DOCUMENTS

| 4,099,225 | A | * | 7/1978 | Nygaard ................... 363/56.03 |
| 4,204,266 | A | * | 5/1980 | Kammiller et al. ............ 363/98 |
| 4,789,777 | A | * | 12/1988 | Takami et al. ........... 250/214 A |
| 5,768,341 | A | * | 6/1998 | Pryor et al. ............... 379/29.11 |
| 5,917,313 | A | * | 6/1999 | Callahan, Jr. ................ 323/288 |
| 6,262,567 | B1 | | 7/2001 | Bartlet ........................ 323/303 |
| 6,316,926 | B1 | * | 11/2001 | Savo et al. .................. 323/282 |

* cited by examiner

*Primary Examiner*—Brian Sircus
*Assistant Examiner*—Zeev Kitov

(57) ABSTRACT

An electrical system is described which comprises at least one function board and at least one voltage converter. The function board and the voltage converter are connected such that a voltage generated by the voltage converter is supplied to the function board. The electrical circuit comprises a power control circuit for controlling the voltage generated by the voltage converter wherein the power control circuit is clamped if the voltage converter is turned off.

7 Claims, 3 Drawing Sheets

ELECTRICAL SYSTEM LIKE A TESTING SYSTEM FOR TESTING THE CHANNELS OF A COMMUNICATION SYSTEM

BACKGROUND OF THE INVENTION

1. Field of the Invention

The invention relates to an electrical system like a testing system for testing the channels of a communication system.

2. Brief Description of Related Developments

Such electrical system comprises at least one function board and at least one voltage converter, wherein the function board and the voltage converter are connected such that a voltage generated by the voltage converter is supplied to the function board. For the purpose of controlling the voltage generated by the voltage converter, a power control circuit is provided.

It is possible that the voltage converter is turned off. As the power control circuit is not turned off, it keeps on trying to increase the output voltage of the voltage converter by increasing its control signal forwarded to the voltage converter. If, then, the voltage converter is turned on again, the control signal received from the power control circuit is too high so that the output voltage generated by the voltage converter overshoots over the required reference voltage.

SUMMARY OF THE INVENTION

It is therefore an object of the invention to provide an electrical system as described above with the ability to generate an output voltage which does not overshoot when the voltage converter is turned on.

This object is solved by an electrical system according to claim 1.

In particular, the electrical system comprises a power control circuit for controlling the voltage generated by the voltage converter wherein the power control circuit is clamped if the voltage converter is turned off. This means that the output signal of the power control circuit is limited if the voltage converter is turned off.

The clamping or limiting of the power control circuit has the advantage that the power control circuit does not keep on trying to increase the output voltage of the voltage converter in the state when the voltage converter is turned off. As a consequence, if the voltage converter is turned on again, the control signal from the power control circuit to the voltage converter is not high so that the output voltage of the voltage converter does not overshoot.

It is advantageous if the electrical circuit comprises an operational amplifier with a switch connected between one of its inputs and its output wherein the switch is closed if the voltage converter is turned off. Furthermore, it is advantageous if the inputs of the operational amplifier are connected to an actual voltage and a reference voltage wherein the switch is connected to the input of the actual voltage. Furthermore, a capacitor may be connected in parallel to the switch.

BRIEF DESCRIPTION OF THE DRAWINGS

The invention together with further objects, advantages, features and aspects thereof will be more clearly understood from the following description taken in connection with the accompanying drawings.

DETAILED DESCRIPTION OF THE PREFERRED EMBODIMENT(S)

Figure 1:
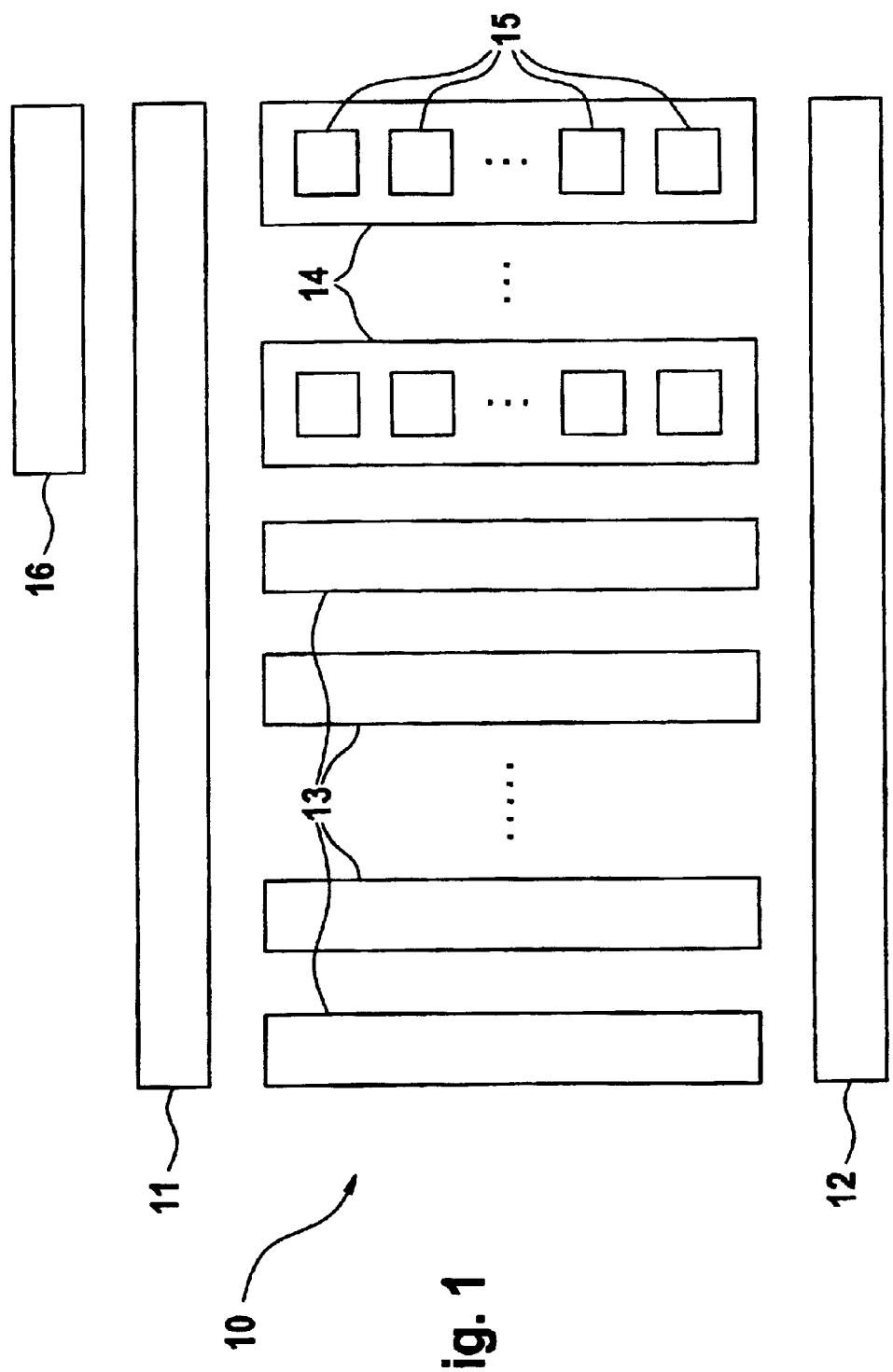
FIG. 1 is a schematic block diagram of an electrical system comprising at least one function board and at least one power supply board.

In FIG. 1, an electrical system 10 is shown, for example an electrical testing system for testing the channels of a communication system. The electrical system 10 is comprised in a rack or the like which provides a front plane board 11 and a back plane board 12. In between the front plane board 11 and the back plane board 12, a number of boards may be plugged into the rack.

As shown in FIG. 1, the electrical system 10 is provided with a number of function boards 13 and a number of power supply boards 14. The function boards 13 may e.g. comprise the electrical circuits for testing the channels of the communication system. As an example, eight so-called channel boards may be present within the electrical system 10. The power supply boards 14 comprise the electrical circuits for creating the required voltages for the function boards. As an example, four such power supply boards 14 may be present within the electrical system 10.

Each one of the power supply boards 14 comprises a number of voltage converters 15 wherein each one of these voltage converters 15 is used to create on of the required voltages. As an example, five voltage converters 15 are present within each one of the power supply boards 14.

The front plane board 11 and the back plane board 12 comprise the connections between the function boards 13 and the power supply boards 14. As well, the front plane board 11 and the back plane board 12 provide grounds for the electrical circuits on the function boards 13 and the power supply boards 14, i.e. a front plane ground and a back plane ground.

Furthermore, a power control board 16 is connected to the front plane board 11 which comprises electrical circuits in particular for controlling the voltages created on the power supply boards 14.

Figure 2:
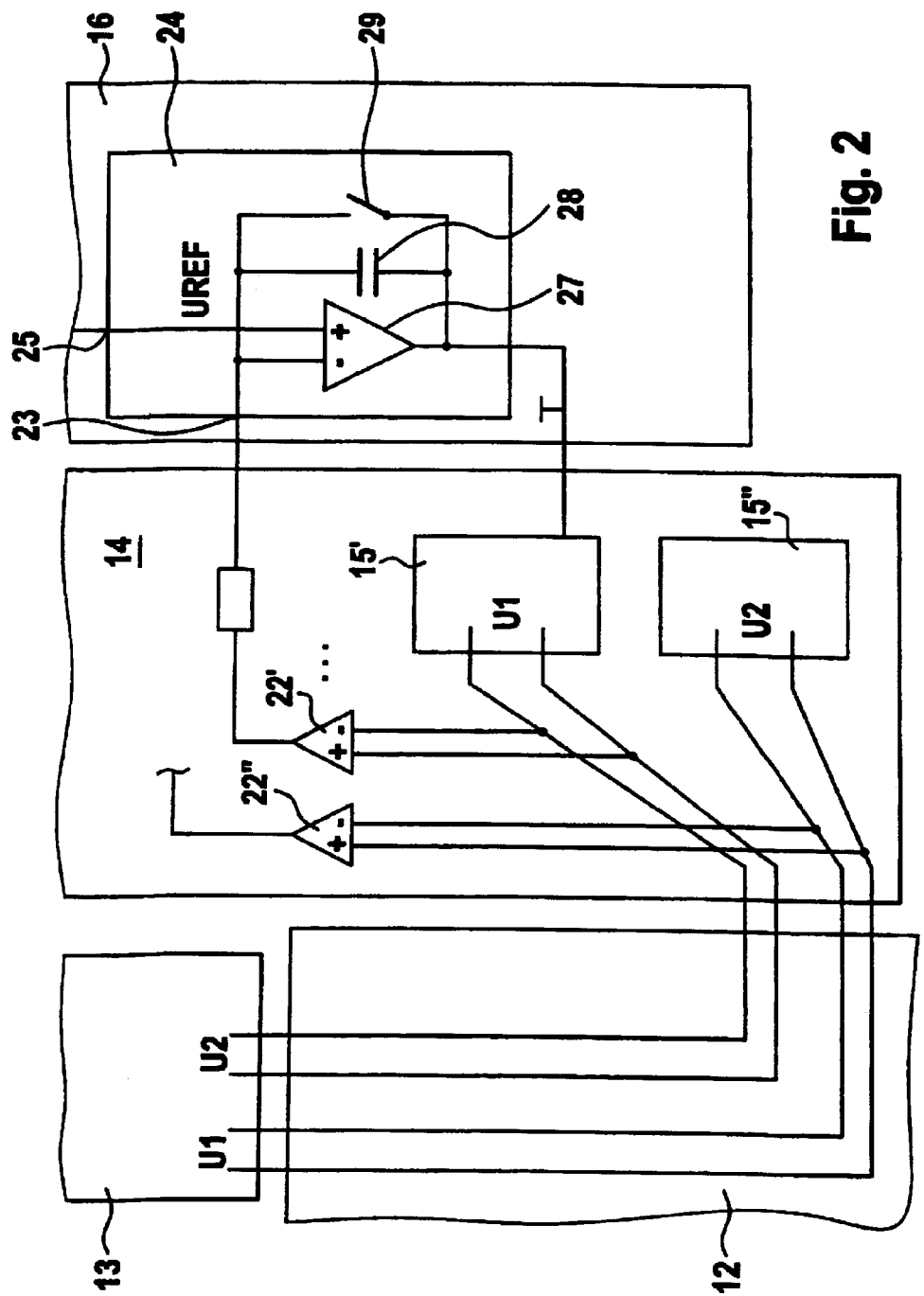
FIG. 2 is a more detailed schematic block diagram of the two function boards and the power supply board of FIG. 1.

In FIG. 2, one of the function boards 13, the back plane board 12, one of the power supply boards 14 with two voltage converters 15', 15" and the power control board 16 are shown.

The voltage converter 15' creates a first voltage U1 and the voltage converter 15" creates a second voltage U2. The two voltages U1, U2 may be different or equal.

These two voltages U1, U2 are provided to the function board 13. The electrical connections between the voltage converters 15', 15" and the function board 13 are carried out via the back plane board 12.

In order to control the voltage generated by one of the voltage converters 15', 15", a power control circuit 24 is provided on the power control board 16 being associated to the respective one of the voltage converters 15', 15".

As shown in FIG. 2, the voltages U1, U2 are connected to the positive and the negative inputs of two operational amplifiers 22', 22". The output signal of the operational amplifier 26' is forwarded via a resistor as an actual voltage to an input 23 of the power control circuit 24. Furthermore, the power control circuit 24 is provided with an input 25 to receive a reference voltage UREF.

The power control circuit 24 comprises an operational amplifier 27, a capacitor 28 and a switch 29. The positive input of the operational amplifier 27 is connected to the input 25 of the power control circuit 24 concerning the reference voltage UREF. The negative input of the operational amplifier 27 is connected to the input 23 of the power control circuit 24 concerning the actual voltage. The capacitor 28 and the switch 29 are connected in parallel in between the negative input and the output of the operational amplifier 27. At the output of the operational amplifier 27, a control signal T is available which is forwarded to the voltage converter 15'.

Similar circuits, in particular a similar power control circuit, are provided on the power control board 16 in connection with the voltage converter 15". All connections between the power supply board 14 and the power control board 16 may be passed via the front plane board 11 (not shown in FIG. 2).

Figure 3:
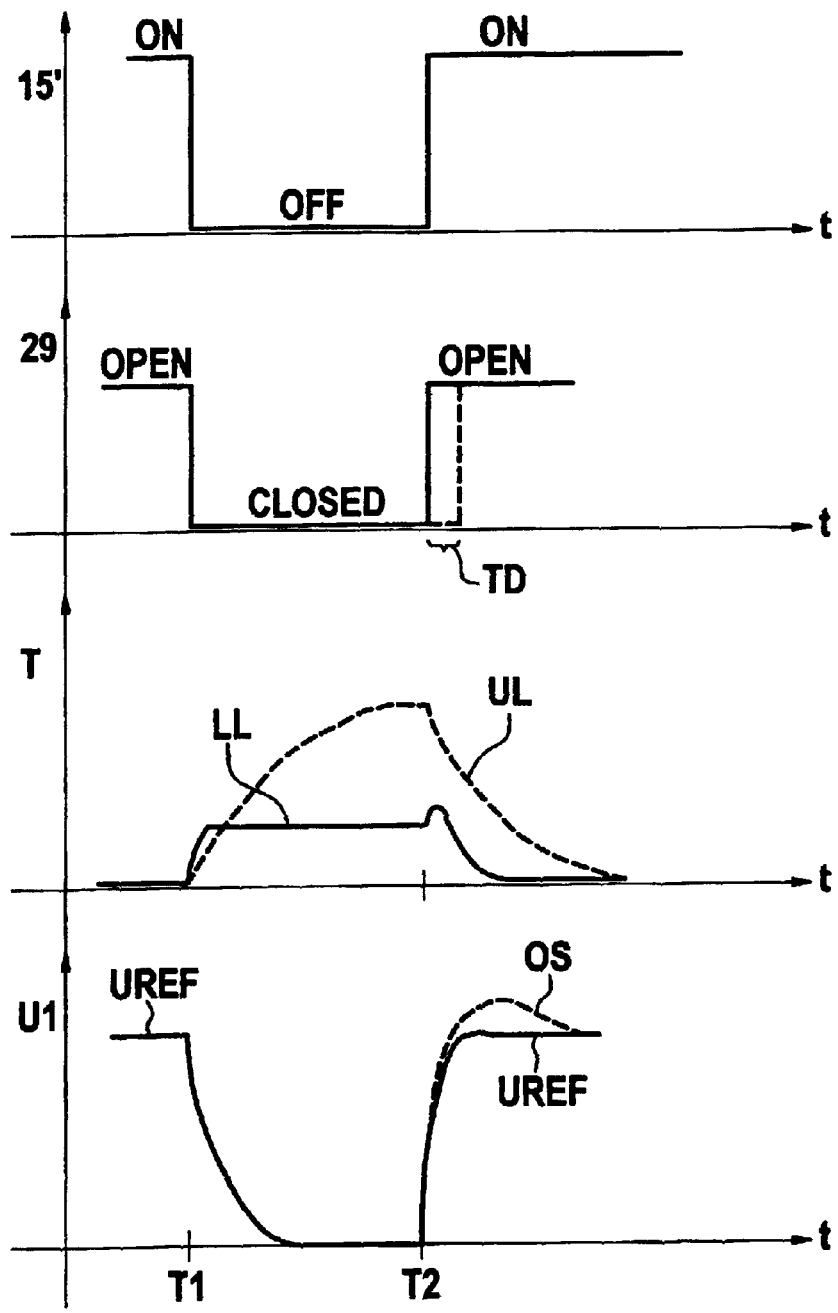
FIG. 3 shows schematic diagrams of signals of the electrical system over the time.

FIG. 3 shows four signals of the electrical system 10.

The first signal from the top of FIG. 3 relates to the voltage converter 15' and shows the state of the voltage converter 15'. If the signal is ON, the voltage converter 15' is turned on and generates the voltage U1. If the signal is OFF, the voltage converter 15' is turned off and does not generate any output voltage. The points in time of the switching of the voltage converter 15' are characterized by the reference numerals T1 and T2.

The second signal from the top relates to the switch 29. At the point in time T1, i.e. if the voltage converter 15' is turned off, the switch 29 is closed. At the point in time T2, i.e. if the voltage converter 15' is turned on again, the switch 29 is opened. As an alternative, it is possible that the opening of the switch 29 at the point in time T2 is delayed by a time period TD.

The third signal from the top of FIG. 3 shows the signal T which is forwarded from the power control circuit 24 to the voltage converter 15'. The signal T is a control signal for regulating the voltage U1 generated by the voltage converter 15'. The signal T is created such that the difference between the reference voltage UREF at the input 25 of the power control circuit 24 and the actual voltage at the input 23 of the power control circuit 24 becomes zero. This means that the signal T is created such that the voltage U1 generated by the voltage converter 15' becomes equal to the reference voltage UREF.

The fourth signal from the top is the voltage U1 which is generated by the voltage converter 15'. If the voltage converter 15' is turned on, the voltage U1 corresponds to the reference voltage UREF provided at the input 25 of the power control circuit. If the voltage converter 15' is tuned off, the voltage U1 is zero.

Without the switch 29, the signal T would increase to the upper limit UL of the operational amplifier 27 after the voltage converter 15' is turned off at the point in time T1 as it is shown in a dashed line. This increase would be a consequence of the fact that the power control circuit 24 would not recognize that the voltage converter 15' is switched off and that, therefore, the power control circuit 24 would keep on trying to increase the output voltage U1 of the voltage converter 15'.

If, afterwards, without the switch 29, the voltage converter 15' would be turned on again at the point in time T2, the voltage U1 generated by the voltage converter 15' would increase very fast due to the high value of the control signal T with the consequence of an overshoot OS.

However, with the switch 29 as shown in FIG. 2, the signal T does not increase to the upper limit UL of the operational amplifier 27 after the voltage converter 15' is turned off at the point in time T1. Instead, due to the closed switch 29, the signal T remains at a lower level LL as shown in FIG. 2.

Then, if the voltage converter 15' is turned on again at the point in time T2, the voltage U1 generated by the voltage converter 15' does not comprise the overshoot OS anymore. Instead, the voltage U1 increases fast but comprises only a little overshoot when reaching the level of the reference voltage UREF.

If the switch 29 is opened with the delay of the time period TD, then the increase of the voltage U1 is even better in a sense that the mentioned little overshoot is even less. As a further alternative, it is possible to close the switch only during the aforementioned time period TD.

In all these cases, the closed switch 29 clamps the power control circuit 24, in particular the operational amplifier 27. The closed switch 29 does not allow the operational amplifier 27 to drive its output signal, i.e. the control signal T at its upper limit UL. Instead, the closed switch 29 limits the signal T to a value which is not absolutely correct, but almost correct in the point in time T2 when the voltage converter 15' is turned on again.

It shall be mentioned that the above described electrical system 10 may also comprise only a single voltage converter so that only a single voltage is provided to the function board.

What is claimed is:

1. An electrical system comprising:

at least one funtion board and at least one voltage converter, wherein the function board and the voltage converter are connected such that a voltage provided by the voltage converter is supplied to the function board; and a power control circuit for providing a control signal for controlling the voltage generated by the voltage converter wherein the control signal of the power control circuit is clamped if the voltage converter is turned off.

2. The electrical circuit of claim 1 wherein the control signal of the power control circuit is limited if the voltage converter is turned off.

3. The electrical circuit of claim 1 comprising an operational amplifier with a switch connected between one of its inputs and its output wherein the switch is closed if the voltage converter is turned off.

4. The electrical circuit of claim 3 wherein the inputs of the operational amplifier are connected to an actual voltage and a reference voltage and wherein the switch is connected to the input of the actual voltage.

5. The electrical circuit of claim 3 wherein a capacitor is connected n parallel to the switch.

6. The electrical circuit of claim 3 wherein the output of the operational amplifier is connected to the voltage converter as a control signal.

7. The electrical system of claim 1 wherein the function board is a o-called channel board for testing the channels of a communication system.

* * * * *

UNITED STATES PATENT AND TRADEMARK OFFICE
CERTIFICATE OF CORRECTION

| | | |
|---|---|---|
| PATENT NO. | : 6,944,000 B2 | Page 1 of 1 |
| APPLICATION NO. | : 10/305286 | |
| DATED | : September 13, 2005 | |
| INVENTOR(S) | : Nuessle | |

It is certified that error appears in the above-identified patent and that said Letters Patent is hereby corrected as shown below:

Column 4, line 36, claim 1, delete "funtion" and insert -- function --.

Column 4, line 57, claim 5, delete "n" and insert -- in --.

Column 4, line 62, claim 7, delete "o-called" and insert -- so-called --.

Signed and Sealed this

Fourteenth Day of November, 2006

JON W. DUDAS
*Director of the United States Patent and Trademark Office*